US010962687B2

(12) United States Patent
Nouvelot et al.

(10) Patent No.: US 10,962,687 B2
(45) Date of Patent: Mar. 30, 2021

(54) OPTICAL ARTICLE COATED WITH AN ANTIREFLECTION COATING COMPRISING A SUB-LAYER PARTIALLY FORMED UNDER ION ASSISTANCE AND ITS MANUFACTURING PROCESS

(71) Applicant: ESSILOR INTERNATIONAL, Charenton le Pont (FR)

(72) Inventors: Luc Nouvelot, Charenton le Pont (FR); Johann Rotte, Charenton le Pont (FR); Karin Scherer, Charenton le Pont (FR); Daniel Vallet, Charenton le Pont (FR)

(73) Assignee: Essilor International, Charenton-le-Pont (FR)

( * ) Notice: Subject to any disclaimer, the term of this patent is extended or adjusted under 35 U.S.C. 154(b) by 923 days.

(21) Appl. No.: 15/094,235

(22) Filed: Apr. 8, 2016

(65) Prior Publication Data
US 2016/0223716 A1    Aug. 4, 2016

Related U.S. Application Data

(63) Continuation of application No. 12/664,642, filed as application No. PCT/FR2008/051051 on Jun. 12, 2008, now abandoned.

(30) Foreign Application Priority Data

Jun. 13, 2007 (FR) ...................... 0755749

(51) Int. Cl.
*G02B 1/115* (2015.01)
*G02B 1/116* (2015.01)
*G02B 1/14* (2015.01)
*G02C 7/02* (2006.01)
*C23C 14/02* (2006.01)
*C23C 14/10* (2006.01)
*C23C 14/30* (2006.01)
*C23C 14/54* (2006.01)
*C23C 14/22* (2006.01)
*G02B 5/28* (2006.01)

(52) U.S. Cl.
CPC ............ *G02B 1/115* (2013.01); *C23C 14/022* (2013.01); *C23C 14/024* (2013.01); *C23C 14/10* (2013.01); *C23C 14/22* (2013.01); *C23C 14/30* (2013.01); *C23C 14/546* (2013.01); *G02B 1/116* (2013.01); *G02B 1/14* (2015.01); *G02C 7/022* (2013.01); *G02B 5/285* (2013.01); *G02C 2202/16* (2013.01); *Y10T 428/2495* (2015.01); *Y10T 428/24942* (2015.01)

(58) Field of Classification Search
CPC .......... C23C 14/024–14/025; G02B 1/00–1/18
See application file for complete search history.

(56) References Cited

U.S. PATENT DOCUMENTS

| 5,268,781 | A  | 12/1993 | Shigeta et al. ............... 349/125 |
| 7,261,957 | B2 | 8/2007  | Bijkerk et al. ............... 428/701 |
| 7,267,893 | B2 | 9/2007  | Okada et al. ................ 428/969 |
| 7,405,415 | B2 | 7/2008  | Shang ....................... 250/492.3 |
| 2003/0116872 | A1 | 6/2003 | Klemm et al. .............. 264/1.31 |
| 2004/0075910 | A1 | 4/2004 | Shozude et al. ............. 359/603 |
| 2006/0023311 | A1 | 2/2006 | Scherer et al. ............. 359/603 |
| 2007/0178315 | A1 | 8/2007 | Thomas et al. ............. 428/426 |

FOREIGN PATENT DOCUMENTS

| CN | 1739044 A | 2/2003 |
| EP | 1184685 | 3/2002 |
| EP | 1184686 | 3/2002 |
| EP | 1566666 | 8/2005 |
| JP | 62-100701 | 5/1987 |
| JP | 02-230101 | 9/1990 |
| JP | H05-034502 | 2/1993 |
| JP | 2004-341052 | 12/2004 |
| JP | 2005-232565 | 9/2005 |
| JP | 2005-234188 | 9/2005 |
| JP | 2007-065259 | 3/2007 |
| JP | 2007-078780 | 3/2007 |
| JP | 2007-127681 | 5/2007 |
| WO | WO 2002/096627 | 12/2002 |

(Continued)

OTHER PUBLICATIONS

"Adjacent". http://www.thefreedictionary.com/adjacent. Retrieved Apr. 19, 2014.
Dobrowolski, J.A. (ed. Bass et al.), "Handbook of Optics: vol. I, Fundamentals, Techniques, and Design", McGraw-Hill, Inc., (1995); pp. 42.3-42.130.
Friz et al., "Coating Materials", web.archive.org/web/20060518045722/ http://www.thinfilmproducts.umicore.com/library/pdf/article_coating_ materials_12june03.pdf, (2006); pp. 105-130.
Machine Translation of JP2007-078780. Retrieved Jul. 15, 2012.
Machine translation of JP2007-127681. Retrieved Mar. 9, 2013.

(Continued)

*Primary Examiner* — Prashant J Khatri
(74) *Attorney, Agent, or Firm* — Norton Rose Fulbright US LLP

(57) ABSTRACT

The invention relates to an optical article provided with antireflection properties, comprising a substrate having at least one main surface coated with an antireflection coating comprising, starting from the substrate: a sub-layer comprising two adjacent layers formed from the same material, the sum of the thicknesses of the two adjacent layers being greater than or equal to 75 nm; and a multilayered antireflection stack comprising at least one high refractive index layer and at least one low refractive index layer, the deposition of the first of said two adjacent layers of the sub-layer having been carried out without ion assistance and the deposition of the second of said two adjacent layers of the sub-layer having been carried out under ion assistance. The invention also relates to a process for manufacturing such an optical article.

20 Claims, No Drawings

(56) References Cited

FOREIGN PATENT DOCUMENTS

WO   WO 2005/059603   6/2005

OTHER PUBLICATIONS

Office Communication issued in Chinese Patent Application No. 200880102530, dated Dec. 7, 2011. (English translation).
Office Communication issued in Japanese Patent Application No. 2010-511705, dated Jul. 17, 2012.
Schulz et al., "Optical coating on transparent plastics", VIP Vacuum's Best, (2005); pp. 26-29.

OPTICAL ARTICLE COATED WITH AN ANTIREFLECTION COATING COMPRISING A SUB-LAYER PARTIALLY FORMED UNDER ION ASSISTANCE AND ITS MANUFACTURING PROCESS

CROSS-REFERENCE TO RELATED APPLICATIONS

This application is a continuation of co-pending U.S. patent application Ser. No. 12/664,642 filed Dec. 17, 2009, and claims priority to International Application No. PCT/FR2008/051051 filed 12 Jun. 2008, and French Application No. 0755749 filed on 13 Jun. 2007. The entire text of each of the above-referenced disclosures is specifically incorporated herein by reference without disclaimer.

FIELD OF THE INVENTION

The invention relates to an optical article comprising a substrate coated with an antireflection coating comprising a sub-layer, having in particular an improved abrasion resistance, as well as a process for manufacturing such an optical article.

BACKGROUND OF THE INVENTION

In the ophthalmic optics field, it is usual to coat an ophthalmic lens with various coatings so as to impart various mechanical and/or optical properties to this lens. Thus, classically, coatings such as impact-resistant, anti-abrasion and/or antireflection coatings are successively formed onto an ophthalmic lens.

An antireflection coating is defined as being a coating, deposited onto the surface of an optical article, which improves the antireflection properties of the final optical article. It enables to reduce the light reflection at the article-air interface within a substantially broad range of the visible spectrum.

Anti-reflection coatings are well known and classically comprise a mono-layer or multi-layer stack of dielectric materials such as SiO, $SiO_2$, $Al_2O_3$, $MgF_2$, LiF, $Si_3N_4$, $TiO_2$, $ZrO_2$, $Nb_2O_5$, $Y_2O_3$, $HfO_2$, $Sc_2O_3$, $Ta_2O_5$, $Pr_2O_3$, or combinations thereof.

As is also well known, antireflection coatings are preferably multilayered coatings comprising alternatively high refractive index layers and low refractive index layers.

SUMMARY OF THE INVENTION

It is known to interleave a relatively thick sub-layer between the substrate and the high refractive index and low refractive index layers of the antireflection coating so as to improve the abrasion resistance and/or scratch resistance of said coating. This sub-layer may comprise one or more layer(s).

The deposition of the layers forming the sub-layer and the multilayered antireflection stack is traditionally made by vapor phase deposition, optionally under ion beam assistance. The ion assisted deposition method or IAD is notably described in the US patent application 2006/017011 and in the U.S. Pat. No. 5,268,781. It does not require any heating of the substrates, which is interesting for coating heat-sensitive substrates such as glass or plastic substrates.

The evaporation under ion assistance consists in depositing onto a substrate a film of material by vacuum evaporation by simultaneously bombarding the surface of the substrate with an ion beam delivered by an ion gun. The ion bombardment leads to an atomic rearrangement in the coating being formed, which increases its density. The IAD not only allows an improvement of the deposited layer adhesion, but also an increase in their refractive index.

The patent application WO 2005/059603, in the name of the applicant, describes an ophthalmic lens substrate coated with a multilayered colored antireflection coating, deposited without ion assistance, and with an anti-fouling coating. The antireflection coating is composed of a 100-110 nm-thick silica sub-layer, and of visible-absorbing, substoichiometric titanium dioxide $TiO_x$ (x<2)-based, alternating high refractive index layers and low refractive index layers (LI) based on $SiO_2$ doped with 1-5% by weight of $Al_2O_3$, relative to the total weight of $SiO_2+Al_2O_3$.

Prior to depositing the antireflection coating, the surface of the substrate is submitted to a treatment to improve the adhesion of the sub-layer. This surface preparation, called IPC (Ion Pre-cleaning) does consist in an ion bombardment pre-cleaning of the substrate through argon ions using an ion gun.

The optical article manufactured according to the teaching of the patent application WO 2005/059603 has good abrasion resistance properties, which may nevertheless be further improved.

The Japanese patent H05-034502 describes the preparation of optical articles comprising an antireflection coating composed of a $0.125\lambda$ to $0.8\lambda$-thick laminated sub-layer, with $\lambda=500$ nm and of an antireflection stack comprising a high refractive index layer interleaved between two low refractive index layers.

The laminated sub-layer comprises the following three layers, that all have been deposited without ion assistance: a $SiO_2$ layer with a low thickness ($0.05\lambda-0.15\lambda$) and a refractive index n=1.45-1.47, a $Ta_2O_5$ layer with a very low thickness ($0.01\lambda-0.10\lambda$) and a refractive index n=2-2.1, and a $SiO_2/Al_2O_3$ layer with a high thickness ($0.75\lambda-1.50\lambda$) and a refractive index n=1.48-1.52, these three layers being deposited onto the substrate in the order they have been mentioned.

Using this three-layered sub-layer instead of a single $SiO_2/Al_2O_3$ layer makes it possible to improve the heat resistance properties of the optical article. This patent does not relate to any abrasion resistance improvement.

The European patents EP 1184685 and EP 1184686 (Hoya Corporation) describe an optical element comprising a plastic substrate coated with a Nb (niobium metal) or $SiO_2$ sub-layer and an antireflection stack. The sub-layer (only if composed of niobium), and some layers within the antireflection stack may be deposited by evaporation under argon ion assistance. The thus prepared article has a good thermal and scratch resistance, knowing that the abrasion resistance thereof has not been evaluated.

It is thus an objective of the present invention to provide a transparent optical article, in particular an ophthalmic lens, comprising a mineral or an organic glass substrate and an antireflection coating including a sub-layer, which does advantageously possess both abrasion resistance and adhesion properties improved as compared to the optical articles of the prior art.

The prepared optical articles should retain outstanding transparency properties, have a good resistance to a hot water-dip treatment followed with a superficial mechanical stress, and be free of any optical defects.

A further objective of the invention is a method for manufacturing optical articles such as previously mentioned, which could be easily integrated into the classical optical article manufacturing chain and would preferably avoid heating the substrate.

The previously mentioned inventors have found that modifying the process for making the antireflection coating sub-layer would enable to aim at all the previously mentioned objectives.

The hereabove mentioned objectives are thus aimed at according to the invention through an optical article with antireflection properties, comprising a substrate having at least one main surface coated with an antireflection coating comprising, starting from the substrate:
- a sub-layer comprising two adjacent layers which are preferably formed from the same material, the sum of the thicknesses of these two adjacent layers being greater than or equal to 75 nm; and
- a multilayered antireflection stack comprising at least one high refractive index layer and at least one low refractive index layer, the deposition of the first of said sub-layer two adjacent layers having been carried out without ion assistance and the deposition of the second of said sub-layer two adjacent layers having been carried out under ion assistance.

The invention further relates to a manufacturing process of such an optical article provided with antireflection properties, comprising at least the following steps of:
- providing an optical article comprising a substrate having at least one main surface;
- depositing onto a main surface of the substrate a sub-layer having an exposed surface, where said sub-layer comprises two adjacent layers which are preferably formed from the same material, the deposition of the first of these two adjacent layers being carried out without ion assistance, the deposition of the second of these two adjacent layers being carried out under ion assistance, and the sum of the thicknesses of the two adjacent layers being greater than or equal to 75 nm;
- depositing onto said exposed surface of the sub-layer a multilayered antireflection stack comprising at least one high refractive index layer and at least one low refractive index layer,
- recovering an optical article comprising a substrate having one main surface coated with an antireflection coating comprising said sub-layer and said multilayered stack.

In the present application, when an optical article is provided with one or more coating(s) on its surface, "depositing a layer or a coating onto the article" is intended to mean that a layer or a coating is deposited onto the visible surface (exposed) of the article external coating, that is to say its outermost coating relative to the substrate.

As used herein, a coating which lies "on" a substrate or which has been deposited "onto" a substrate is defined as a coating which (i) is positioned over the substrate, (ii) is not necessarily in contact with the substrate, i.e. one or more intermediary coating(s) may be arranged between the substrate and the coating of interest, and (iii) does not necessarily cover the substrate in full.

When a "layer 1 is placed under a layer 2", it means that the layer 2 is the farthest from substrate as compared to the layer 1.

As used herein, an "antireflection multilayered stack" is intended to mean the multilayered stack of the antireflection coating which has been deposited onto the antireflection coating sub-layer. In the following description, it will be simply referred to as the "multilayered stack."

The optical article prepared according to the invention comprises a substrate, preferably transparent, in mineral or organic glass having rear and front main faces, at least one of which being coated with an anti-reflection coating comprising a sub-layer coated with a multilayered stack, preferably both main faces thereof. The multilayered stack does preferably directly contact the sub-layer.

As used herein, the rear face (generally the concave face) of the substrate is the face which, in use, is the closest to the wearer's eye. On the contrary, the front face (generally the convex face) of the substrate is the face which, in use, is the farthest from the wearer's eye.

Generally speaking, the sub-layer and the multilayered stack of the antireflection coating of the optical article of the invention may be deposited onto any substrate, and preferably onto organic glass substrates, for example a thermoplastic or thermosetting plastic material.

To be mentioned as thermoplastic materials to be suitably used as substrates are (meth)acrylic (co)polymers, particularly methyl poly(methacrylate) (PMMA), thio(meth)acrylic (co)polymers, polyvinylbutyral (PVB), polycarbonates (PC), polyurethanes (PU), poly(thiourethanes), polyol allylcarbonate (co)polymers, thermoplastic copolymers of ethylene/vinyl acetate, polyesters such as polyethylene terephthalate (PET) or polybutylene terephthalate (PBT), polyepisulfides, polyepoxides, polycarbonate and polyester copolymers, cyclo-olefin copolymers such as copolymers of ethylene and norbornene or ethylene and cyclopentadiene and combinations thereof.

By (co)polymer, it is meant a copolymer or a polymer. By (meth)acrylate, it is meant an acrylate or a methacrylate.

Preferred substrates of the invention include substrates obtained by the polymerization of alkyl (meth)acrylates, in particular $C_1$-$C_4$ alkyl (meth)acrylates such as methyl (meth)acrylate and ethyl (meth)acrylate, polyethoxylated aromatic (meth)acrylates such as the polyethoxylated bisphenolate di(meth)acrylates, allyl derivatives such as aliphatic or aromatic polyol allyl carbonates, linear or branched, thio(meth)acrylates, episulfides, and precursor mixtures of polythiols and polyisocyanates (to give polythiourethanes).

As used herein, a polycarbonate (PC) means both homopolycarbonates and copolycarbonates and block copolycarbonates. Polycarbonates are commercially available, for example from the GENERAL ELECTRIC COMPANY under the trade name LEXAN®, the TEIJIN company under the trade name PANLITE®, the BAYER company under the trade name BAYBLEND®, the MOBAY CHEMICHAL Corp. under the trade name MAKROLON® and the DOW CHEMICAL Co. under the trade name CALIBRE®.

Suitable examples of polyol allyl carbonate (co)polymers to be mentioned include (co)polymers of ethyleneglycol bis (allyl carbonate), of diethyleneglycol bis 2-methyl carbonate, of diethyleneglycol bis (allyl carbonate), of ethyleneglycol bis (2-chloro allyl carbonate), of triethyleneglycol bis (allyl carbonate), of 1,3-propanediol bis (allyl carbonate), of propyleneglycol bis (2-ethyl allyl carbonate), of 1,3-butenediol bis (allyl carbonate), of 1,4-butenediol bis (2-bromo allyl carbonate), of dipropyleneglycol bis (allyl carbonate), of trimethyleneglycol bis (2-ethyl allyl carbonate), of pentamethyleneglycol bis (allyl carbonate), of isopropylene bisphenol A bis (allyl carbonate).

Particularly recommended substrates are the substrates obtained by (co)polymerization of diethyleneglycol bis allyl carbonate, marketed, for example, under the trade name CR-39® by the PPG Industries company (ESSILOR ORMA® lenses).

Other particularly recommended substrates further include substrates obtained by polymerization of thio(meth) acrylic monomers, such as those described in the French patent application FR 2 734 827.

The substrates may obviously be obtained by polymerizing mixtures of the above monomers or they also may comprise combinations of these polymers and (co)polymers.

Preferred organic substrates are those having a thermal expansion coefficient ranging from $50 \cdot 10^{-6\circ}$ C.$^{-1}$ to $180 \cdot 10^{-6\circ}$ C.$^{-1}$, preferably from $100 \cdot 10^{-6\circ}$ C.$^{-1}$ to $180 \cdot 10^{-6\circ}$ C.$^{-1}$.

Prior to depositing the sub-layer onto the substrate optionally coated for example with an abrasion- and/or scratch-resistant layer, it is usual to submit the surface of said optionally coated substrate, to a physical or chemical activation treatment, to improve the adhesion of the sub-layer. This pre-treatment is generally carried out under vacuum. It may be a bombardment with energetic species, for example an ion beam method ("Ion Pre-Cleaning" or "IPC") or an electron beam method, a corona treatment, an ion spallation treatment, an ultraviolet treatment or a plasma treatment under vacuum, typically an oxygen or an argon plasma. It may also be an acid or a base surface treatment and/or a solvent surface treatment (using water or an organic solvent). Many treatments may be combined. Thanks to these cleaning treatments, the cleanliness of the substrate surface is optimized.

By energetic species, it is meant species with an energy ranging from 1 to 300 eV, preferably from 10 to 150 eV, and more preferably from 10 to 150 eV and most preferably from 40 to 150 eV. Energetic species may be chemical species such as ions, radicals, or species such as photons or electrons.

The preferred pre-treatment of the substrate surface is the ion bombardment treatment, performed by means of an ion gun, the ions being particles made of gas atoms from which one or more electron(s) is or are extracted. Argon (Ar$^+$ ions) is preferably employed as ionized gas, but also oxygen, or combinations thereof, under an accelerating voltage typically ranging from 50 to 200 V, a current density typically ranging from 10 to 100 µA/cm$^2$ on the activated surface, and typically under a residual pressure in the empty chamber which may vary from $8 \cdot 10^{-5}$ mbar to $2 \cdot 10^{-4}$ mbar.

According to the present invention, a sub-layer is used in combination with a multilayered stack comprising at least one high refractive index layer and at least one low refractive index layer.

As used herein, a "sub-layer" or "an adhesion layer" is intended to mean a coating that has been deposited onto the substrate (bare or coated) prior to depositing the multilayered stack of the invention. The sub-layer should be sufficiently thick to promote the abrasion resistance of the antireflection coating, but preferably not to the point there are to much overall stress which may lead to adherence problems.

Because it is relatively thick, the sub-layer does not typically take part to the anti-reflecting optical function, particularly where it has a refractive index close to the bare substrate, if the sub-layer is deposited onto the bare substrate, or close to the coating if the sub-layer is deposited onto a coated substrate.

The sub-layer of the invention is a multilayered sub-layer (laminated), preferably a bilayer. In the latter case, it does not comprise any further layers other than both adjacent layers preferably formed from the same material and the sum of physical thicknesses of which is greater than or equal to 75 nm.

The sum of these thicknesses is preferably greater than or equal to 80 nm, more preferably greater than or equal to 100 nm and even more preferably greater than or equal to 150 nm. The sum of the thicknesses of these two adjacent layers is typically lower than 250 nm, more preferably lower than 200 nm.

The antireflection coating sub-layer of the invention comprises two adjacent layers preferably of a similar chemical nature but having different characteristics because of the two different deposition methods used.

Thus, the second of these two adjacent layers to be deposited does possess a higher density as compared to that of the first one, because it was formed under ion assistance whereas the first of these two adjacent layers to be deposited was not. In the following, the first of these two adjacent layers to be deposited will be referred to as being the sub-layer "lower layer" whereas the second of these two adjacent layers to be deposited will be referred to as being the sub-layer "higher layer".

These two adjacent layers of the sub-layer are preferably formed from the same material, which means then, in the context of the present application, that they were formed from the same material, for example by evaporation of the same compound (or the same combination of compounds).

The lower layer and the higher layer of the sub-layer are preferably $SiO_2$-based layers. They may comprise in addition to silica, one or more other materials traditionally used for forming sub-layers, for example one or more materials selected from the dielectric materials hereabove and hereafter described in the present specification. There are preferably, $SiO_2$-based layers that are free of $Al_2O_3$, and most preferably they consist in $SiO_2$.

The lower layer and the higher layer of the sub-layer of the present invention preferably comprise at least 70% by weight of $SiO_2$, more preferably at least 80% by weight and even more preferably at least 90% by weight of $SiO_2$. As already stated, they each comprise in an optimal embodiment 100% by weight of silica.

The thickness ratio of the sub-layer lower layer to the sub-layer higher layer does preferably range from 9:1 to 1:9, more preferably from 4:6 to 6:4. Depending on the embodiment illustrated in the experiment section, this ratio is 1:1. The thicknesses that are mentioned in the present application are physical thicknesses, unless otherwise stated.

When formed from the same material, the lower layer and the higher layer of the sub-layer may be differentiated, in particular by means of a transmission electron microscopy, by an ion beam analysis (RBS) or, where possible, may be evidenced by diffusing a colored material, using their different porosities.

The sub-layer of the invention comprises at least the two previously mentioned adjacent layers. It may comprise additional layers, preferably at most three additional layers, more preferably at most two other layers, interleaved between the optionally coated substrate and said two adjacent layers, particularly if the optionally coated substrate has a high refractive index. These additional layers are preferably thin layers, which function consists in restraining the reflections at the substrate-sub-layer interface (or at the abrasion- and/or scratch-resistant coating-sub-layer interface depending on the situation).

Thus, when the substrate has a high refractive index (i.e. a refractive index greater than or equal to 1.55, preferably greater than or equal to 1.57) and the sub-layer has been deposited directly onto the substrate or the substrate is coated with an abrasion- and/or scratch-resistant coating with a high refractive index (that is to say greater than or equal to 1.55, preferably greater than or equal to 1.57), preferably based on epoxysilanes, and the sub-layer has been deposited directly onto this abrasion- and/or scratch-resistant coating, the sub-layer comprises preferably, in addition to the two adjacent layers preferably formed from the same material and the sum of physical thicknesses of which is greater than or equal to 75 nm, one layer with a high refractive index and with a thickness lower than or equal to 80 nm, more preferably lower than or equal to 50 nm and even more preferably lower than or equal to 30 nm. This layer with a high refractive index does directly contact the high index substrate or the high index abrasion- and/or scratch-resistant coating. This embodiment may obviously be used even if the substrate (or the abrasion- and/or scratch-resistant coating) has a refractive index lower than 1.55

As an alternative, the sub-layer comprises, in addition to the two adjacent layers preferably formed from the same material and the sum of physical thicknesses of which is greater than or equal to 75 nm and to the hereabove mentioned high refractive index layer, one layer composed of a low refractive index material (i.e. lower than or equal to 1.55, preferably lower than or equal to 1.52, more preferably lower than or equal to 1.50) based on $SiO_2$ and free of $Al_2O_3$ or not, with a thickness lower than or equal to 80 nm, more preferably lower than or equal to 50 nm and even more preferably lower than or equal to 30 nm, onto which said high refractive index layer is deposited.

Typically, in this instance, the sub-layer comprises, that have been deposited in this order starting from the substrate, a 25 nm-thick $SiO_2$ layer, a 10 nm-thick $ZrO_2$ layer, said "lower layer" of the sub-layer and said "higher layer" of the sub-layer.

The various layers of the sub-layer are preferably deposited by vacuum evaporation.

The IAD operation the sub-layer higher layer does undergo may be performed by means of an ion gun, where ions are particles composed of gas atoms from which one or more electron(s) is or are extracted. It does preferably consist in bombarding the surface to be treated with oxygen ions, having a current density typically ranging from 10 to 200 µA/cm², preferably from 30 to 100 µA/cm² on the activated surface and typically under a residual pressure in the empty chamber which may vary from $6·10^{-5}$ mbar to $2·10^{-4}$ mbar, preferably from $8·10^{-5}$ mbar to $2·10^{-4}$ mbar. Other ionized gases may be used either combined with oxygen, or not, as for example argon, nitrogen, in particular a mixture of $O_2$ and argon according to a volume ratio ranging from 2:1 to 1:2.

It is recommended not to deposit the sub-layer lower layer under ion assistance. Otherwise, it is as if a sub-layer comprising only one layer with a thickness greater than or equal to 75 nm and a high density was deposited, which causes a decrease in the adhesion of some antireflection coating layers.

Without wishing to be bound to any particular theory, applicant believe that depositing a sub-layer with a thickness greater than or equal to 75 nm under ion assistance gives a more dense sub-layer, which may result in an excessive compression of the antireflection coating and thus may cause a decrease in the adhesion properties thereof. Conducting the deposition of the sub-layer according to the process of the invention enables to improve the abrasion resistance of the final article while limiting the increase in the compressive stress so as to avoid any antireflection coating structural weakening.

The sub-layer of the invention has a total thickness greater than or equal to 75 nm, preferably greater than or equal to 80 nm, more preferably greater than or equal to 100 nm and even more preferably greater than or equal to 150 nm. Its thickness is typically lower than 250 nm, more preferably lower than 200 nm.

The multilayered stack of the antireflection coating is preferably deposited directly onto the exposed surface of the sub-layer, that is to say directly onto the exposed surface of the sub-layer higher layer.

Optionally, the exposed surface of the sub-layer may be submitted, prior to depositing the first layer of the multilayered stack, to a physical or a chemical activation treatment which may be selected from the pre-treatments the substrate may undergo prior to depositing the sub-layer and which have already be mentioned hereabove. The preferred pre-treatment is an ion bombardment. Traditionally conducted under vacuum, by using an ion gun-generated argon ion beam for instance, it typically enables from the one hand to improve the abrasion resistance properties of the antireflection coating, and from the other hand to reinforce its adhesion properties, particularly the adhesion of the multilayered stack to the sub-layer.

Such physical or chemical activation treatments may also be performed on the surface of one or more layer(s) of the multilayered stack, particularly on the surface of the next to last layer of this stack.

In the present application, a layer of the multilayered stack of the antireflection coating (AR) is said to be a high refractive index layer (HI) when its refractive index is greater than 1.55, preferably greater than or equal to 1.6, more preferably greater than or equal to 1.7, even more preferably greater than or equal to 1.8 and most preferably greater than or equal to 1.9. A layer of the multilayered stack of the antireflection coating is said to be a low refractive index layer (LI) when its refractive index is lower than or equal to 1.55, preferably lower than or equal to 1.52. more preferably lower than or equal to 1.50.

Unless otherwise stated, the refractive indexes to which it is referred to in the present application are expressed at 25° C. for a wavelength of 550 nm.

The HI layers are traditional high refractive index layers, well known in the art. They typically comprise one or more mineral oxides such as, without limitation, zirconia ($ZrO_2$), titanium dioxide ($TiO_2$), tantalum pentoxide ($Ta_2O_5$), neodymium oxide ($Nd_2O_5$), praseodymium oxide ($Pr_2O_3$), praseodymium titanate ($PrTiO_3$), $La_2O_3$, $Dy_2O_5$, $Nb_2O_5$, $Y_2O_3$. Optionally, the high index layers may also contain silica or alumina, provided that their refractive index be greater than 1.55, preferably greater than or equal to 1.6, more preferably greater than or equal to 1.7 and even more preferably greater than or equal to 1.9. Preferred materials include $TiO_2$, $PrTiO_3$, $ZrO_2$ and combinations thereof.

According to a particular embodiment of the invention, at least one HI layer of the multilayered stack is a $TiO_2$-based layer which high refractive index is particularly interesting. It is preferably deposited under ion assistance (IAD), which increases the compression of this layer and thus its refractive index.

According to a further particular embodiment of the invention, at least one HI layer of the multilayered stack is a $PrTiO_3$-based layer which high thermal resistance is particularly interesting.

The LI layers are also well known and may comprise, without limitation, $SiO_2$, $MgF_2$, $ZrF_4$, alumina ($Al_2O_3$), $AlF_3$, chiolite ($Na_3Al_3F_{14}$), cryolite ($Na_3[AlF_6]$), and combinations thereof, preferably $SiO_2$ or $SiO_2$ doped with alumina, which contributes to increase the antireflection coating thermal resistance. SiOF layers ($SiO_2$ doped with fluorine) may also be used. Of course, mixtures of these compounds with optionally one or more other materials selected from the dielectric materials previously described in the present specification are such that the refractive index of the resulting layer is such as defined hereabove (≤1.55).

When a LI layer comprising a mixture of $SiO_2$ and $Al_2O_3$ is used, it preferably comprises from 1 to 10%, more preferably from 1 to 8% and even more preferably from 1 to 5% by weight of $Al_2O_3$ relative to the total weight of $SiO_2+Al_2O_3$ in this layer. An excessive amount of alumina may be detrimental to the adhesion of the AR coating.

For example, $SiO_2$ doped with 4% or less $Al_2O_3$ by weight, or $SiO_2$ doped with 8% $Al_2O_3$ may be employed. Commercially available $SiO_2/Al_2O_3$ combinations may be used, such as LIMA® marketed by Umicore Materials AG (refractive index n=1.48-1.50 at 550 nm), or L5® marketed by Merck KGaA (refractive index n=1.48 at 500 nm).

According to a preferred embodiment, at least one LI layer of the multilayered stack comprises a mixture of $SiO_2$ and $Al_2O_3$, preferably consists in a mixture of $SiO_2$ and $Al_2O_3$. According to another preferred embodiment, all the LI layers of the multilayered stack comprise a mixture of $SiO_2$ and $Al_2O_3$, preferably consist in a mixture of $SiO_2$ and $Al_2O_3$. In the latter case, it is particularly preferred when the higher layer and the lower layer of the sub-layer are $SiO_2$-based layers free of $Al_2O_3$.

Typically, the HI layers have a physical thickness varying from 10 to 120 nm, and the LI layers have a physical thickness varying from 10 to 100 nm.

Preferably, the whole thickness of the antireflection coating is lower than 1 micrometer, more preferably lower than or equal to 800 nm and even more preferably lower than or equal to 500 nm. The whole thickness of the antireflection coating is typically higher than 100 nm, preferably higher than 150 nm.

Even preferably, the multilayered stack comprises at least two low refractive index layers (LI) and at least two high refractive index layers (HI). Preferably, the layer total number in the multilayered stack is lower than or equal to 8, more preferably lower than or equal to 6.

LI and HI layers must not necessarily be alternated in the stack, although they may also according to an embodiment of the invention. Two HI layers (or more) may be deposited onto one another; as well as two LI layers (or more) may be deposited onto one another. It is thus interesting as regards the abrasion resistance to stack onto one another for example a $ZrO_2$ HI layer and a $TiO_2$ HI layer rather than using a $TiO_2$ layer instead of these two adjacent HI layers.

The sub-layer is preferably adjacent to a high refractive index layer (HI) in the multilayered stack.

According to another preference, the outer layer of the multilayered stack, that is to say the layer that is the most distant from the substrate, is a layer comprising a combination of silicon dioxide and aluminum oxide, in preferred amounts such as those previously described.

The various layers of the multilayered stack, the so called "optical layers", are preferably deposited by vacuum deposition according to one of the following methods: i) by evaporation, optionally assisted by an ion beam; ii) by spraying with an ion beam; iii) by cathode sputtering; iv) by plasma assisted chemical vapor deposition. These various techniques are described in "Thin Film Processes" and "Thin Film Processes II," Vossen & Kern, Ed., Academic Press, 1978 and 1991, respectively. The particularly recommended technique is vacuum evaporation.

Preferably, the deposition of each of the antireflection coating layers is performed by vacuum evaporation. Such a process does advantageously avoid heating the substrate, which is particularly interesting for organic glasses.

A treating step with energetic species such as previously defined may also be carried out, simultaneously with depositing one or more amongst the various layers of the multilayered stack. In particular, working under ion assistance, preferably with oxygen ions, enables to pack said layers while they are being formed.

Optionally, the deposition of one or more layer(s) of the multilayered stack and/or of the sub-layer is performed within a chamber under vacuum and with gas feeding during the deposition step. In concrete terms, a gas such as, without limitation, argon, oxygen or combinations thereof, is introduced into the chamber for the deposition under vacuum while a layer is being deposited.

This modification to the process for depositing this layer generally enables to limit the stress in the antireflection coating and to reinforce the adhesion of the layers thereof. When such deposition method is used, that is called deposition under gas pressure regulation, is used, it is preferred to work under an oxygen atmosphere (so called "passive oxygen").

It is well known that optical articles have a tendency to get charged with static electricity, especially when they are cleaned under dry conditions by rubbing their surface with a cloth or with a piece of foam or polyester. As a consequence, they may attract and fix small particles in the vicinity, such as dusts, as long as the charge remains on the article. It is well known in the art that an article can be rendered antistatic through incorporation in its surface of one electrically conductive layer. Such method has been applied in the world patent application WO 01/55752 and in the patent EP 0834092. This layer helps in quickly dissipating the charges.

By "antistatic", it is meant the property of not retaining and/or developing an appreciable electrostatic charge. An article is generally considered to have acceptable antistatic properties when it does not attract or fix dust or small particles after one of the surfaces thereof has been rubbed with an appropriate cloth.

Many methods exist for quantifying the antistatic properties of a material.

One of these methods consists in evaluating the static potential of the material. When the static potential of the material (measured when the article has not been charged) is 0 KV+/−0.1 KV (in absolute value), the material is said to be antistatic; on the contrary when its static potential is different from 0 KV+/−0.1 KV (in absolute value), the material is said to be static.

According to another method, the ability of a glass to evacuate a static charge created after rubbing with a cloth or any other electrostatic charge generation process (charge applied by corona . . . ) can be quantified by measuring the time required for said charge to be dissipated. Thus, antistatic glasses have a discharge time in the order of 100 milliseconds, preferably 200 ms or less, while static glasses have a discharge time in the order of several tenth seconds.

The article of the invention can be rendered antistatic through the incorporation of at least one electrically conductive layer within the multilayered stack. The electrically conductive layer may be located anywhere in the antireflection coating, provided that it does not impair significantly the anti-reflection properties thereof. It may for example be deposited onto the sub-layer of the invention and thus form the first layer of the multilayered stack. It is preferably located between two dielectric layers of the multilayered stack and/or under a low refractive index layer of the multilayered stack.

The electrically conductive layer has to be sufficiently thin so as not to impair transparency of the antireflection coating. Generally, its thickness ranges from 0.1 to 150 nm and better from 0.1 to 50 nm, depending on its nature. A thickness lower than 0.1 nm does generally not allow to obtain a sufficient electrical conductivity, while a thickness higher than 150 nm does generally not allow to obtain the required transparency and low absorption characteristics.

The electrically conductive layer is preferably made from an electrically conductive and highly transparent material. In such a case, its thickness preferably ranges from 0.1 to 30 nm, more preferably from 1 to 20 nm and even more preferably from 1 to 15 nm. The electrically conductive layer preferably comprises a metal oxide chosen from indium oxides, tin oxides, zinc oxides and mixtures thereof. Indium-tin oxide ($In_2O_3$:Sn, indium oxide doped with tin) and tin oxide ($In_2O_3$) are preferred. According to the most preferred embodiment of the invention, the electrically conductive and optically transparent layer is an indium-tin oxide layer, abbreviated as ITO.

Generally, the electrically conductive layer contributes to the anti-reflection properties and is a high refractive index layer of the AR coating. Examples are layers made from an electrically conductive and highly transparent material such as ITO layers.

The electrically conductive layer may also be a very thin noble metal layer (Ag, Au, Pt, etc.), typically of less than 1 nm thick, preferably of less than 0.5 nm thick.

As a particularly advantageous characteristic, the multi-layered stack of the antireflection coating comprises at least four dielectric layers, preferably four or five, and optionally one electrically conductive layer which imparts to the article its antistatic properties.

In a preferred embodiment of the invention, the antireflection coating of the invention comprises, in the deposition order onto the substrate surface, a bilayered $SiO_2$ sub-layer with a thickness greater than or equal to 75 nm in accordance with the invention, a $ZrO_2$ layer, typically with a thickness of from 10 to 40 nm and preferably of from 15 to 35 nm, a $SiO_2$ layer or a $SiO_2/Al_2O_3$ layer, preferably a $SiO_2/Al_2O_3$ layer typically with a thickness of from 10 to 40 nm and preferably of from 15 to 35 nm, a $TiO_2$ layer, typically with a thickness of from 40 to 150 nm, preferably of from 50 to 120 nm, a $ZrO_2$ layer, typically with a thickness of from 8 to 30 nm and preferably of from 10 to 25 nm, optionally an electrically conductive layer, preferably an ITO layer, typically with a thickness of from 0.1 to 30 nm, preferably of from 1 to 20 nm, and a $SiO_2$ layer or $SiO_2/Al_2O_3$ layer, preferably a $SiO_2/Al_2O_3$ layer typically with a thickness of from 40 to 150 nm, preferably of from 50 to 100 nm.

It is preferred that the multilayered stack of the invention comprises an electrically conductive layer, and more preferred that the article of the invention comprises a stack composed of $TiO_2/ZrO_2$/electrically conductive layer, the first layer mentioned being the nearest from the substrate.

According to a particularly preferred embodiment of the invention, are successively deposited, starting from the surface of the substrate optionally coated with one or more functional coatings, a $SiO_2$ sub-layer according to the invention with a thickness greater than or equal to 120 nm composed of two adjacent layers formed preferably from the same material, a $ZrO_2$ layer with a thickness of from 20 to 30 nm, a $SiO_2/Al_2O_3$ layer with a thickness of from 20 to 30 nm, a $TiO_2$ layer with a thickness of from 75 to 110 nm, a $ZrO_2$ layer with a thickness of from 10 to 20 nm, an ITO layer with a thickness of from 2 to 18 nm, and a $SiO_2/Al_2O_3$ layer with a thickness of from 60 to 90 nm.

The electrically conductive layer, which is typically a high refractive index layer of the antireflection stack, may be deposited according to any suitable method, for example by vacuum evaporation deposition, preferably ion-beam-assisted (IAD), or by means of a cathode sputtering or ion beam method.

When present, the three $TiO_2/ZrO_2$/electrically conductive layer (preferably ITO) successive layers are preferably all three deposited under ion assistance (IAD), preferably under oxygen ion assistance.

The sub-layer and the multilayered stack may be deposited directly onto a bare substrate. In some applications, it is preferred that the main surface of the substrate be coated with one or more functional coating(s) prior to depositing the antireflection coating of the invention. These functional coatings classically used in optics may be, without limitation, an impact-resistant primer layer, an abrasion- and/or a scratch-resistant coating, a polarized coating, a photochromic coating, an antistatic coating or a colored coating.

The sub-layer and the multilayered stack are preferably deposited onto an abrasion- and/or scratch-resistant coating. The abrasion- and/or scratch-resistant coating may be any layer classically used as an abrasion- and/or scratch-resistant coating in the field of ophthalmic lenses.

The abrasion- and/or scratch-resistant coatings are preferably poly(meth)acrylate- or silane-based hard coatings, comprising typically one or more inorganic fillers so as to improve the hardness and/or the refractive index of the coating once cured.

Abrasion- and/or scratch-resistant hard coatings are preferably prepared from compositions comprising at least one alkoxysilane and/or or a hydrolyzate thereof, resulting for example from a hydrolysis with a hydrochloric acid solution. After the hydrolysis step which typically lasts for 1 to 24 h, preferably for 2 to 6 h, condensation and/or curing catalysts may optionally be added. A surfactant is also preferably added to the composition so as to improve the optical quality of the deposit.

Recommended coatings according to the invention include coatings based on epoxysilane hydrolyzates such as those described in the patents FR 2702486 (EP 0614957), U.S. Pat. Nos. 4,211,823 and 5,015,523.

Many examples of condensation and/or curing catalysts that may be suitably used are given in "Chemistry and Technology of the Epoxy Resins", B. Ellis (Ed.) Chapman Hall, New York, 1993 and "Epoxy Resins Chemistry and Technology" 2d edition, C. A. May (Ed.), Marcel Dekker, New York, 1988.

A preferred abrasion- and/or scratch-resistant coating composition is disclosed in the French patent FR 2702486, in the name of the applicant. It comprises an epoxy trialkoxysilane and dialkyl dialkoxysilane hydrolyzate, colloidal silica and a catalytic amount of an aluminum-based curing catalyst such as aluminum acetylacetonate, the remaining of the composition being essentially comprised of solvents typically used for formulating these compositions. Preferably, the hydrolyzate used is a γ-glycidoxypropyltrimethoxysilane (GLYMO) and dimethyldiethoxysilane (DMDES) hydrolyzate.

The abrasion- and/or scratch-resistant coating composition may be deposited onto the main surface of the substrate by dip-coating or spin-coating. It is then cured by means of the appropriate method (preferably thermal curing, UV-curing).

The thickness of the abrasion- and/or scratch-resistant coating typically varies from 2 to 10 μm, preferably from 3 to 5 μm.

Prior to depositing the abrasion- and/or scratch-resistant coating, it is possible to deposit onto the substrate a primer coating to improve the impact resistance and/or the adhesion of the subsequent layers in the end product.

Such coating may be any impact-resistant primer layer classically used for articles made from a transparent polymer material, such as ophthalmic lenses.

Preferred primer compositions include for example thermoplastic polyurethane-based compositions, such as those described in the Japanese patents JP 63-141001 and JP 63-87223, poly(meth)acrylic primer compositions, such as those described in the American patent U.S. Pat. No. 5,015,523, thermosetting polyurethane-based compositions, such as those described in the patent EP 0404111 and poly(meth)acrylic type latex- or polyurethane type latex-based compositions, such as those described in the U.S. Pat. No. 5,316,791 and EP 0680492.

Polyurethane-based compositions and latex-based compositions are the preferred primer compositions, particularly polyurethane latex type primer compositions.

The poly(meth)acrylic type latexes are latexes of copolymers mainly composed of a (meth)acrylate, such as for example ethyl, butyl, methoxyethyl or ethoxyethyl (meth)acrylate, with a generally minor amount of at least one other co-monomer, such as for example styrene.

Preferred poly(meth)acrylic latexes are latexes of acrylate and styrene copolymers. Such latexes of acrylate and styrene copolymers are commercially available from the ZENECA RESINS company under the trade name NEOCRYL®.

Polyurethane latexes are also known and commercially available. To be mentioned as suitable examples are polyester unit-containing polyurethane latexes. Such latexes are also marketed by the ZENECA RESINS company under the trade name NEOREZ® and by the BAXENDEN CHEMICALS company under the trade name WITCOBOND®.

Marketed primer compositions to be suitably used according to the invention include the Witcobond® 232, Witcobond® 234, Witcobond® 240, Witcobond® 242, Neorez® R-962, Neorez® R-972, Neorez® R-986 and Neorez® R-9603 compositions.

Combinations of these latexes, particularly of polyurethane latexes and poly(meth)acrylic latexes may also be used in the primer compositions.

These primer compositions may be deposited on the article sides by dip-coating or spin-coating, thereafter be dried at a temperature of at least 70° C. and up to 100° C., preferably of about 90° C., for 2 minutes to 2 hours, typically for about 15 minutes, to form primer layers having thicknesses, after curing, ranging from 0.2 to 2.5 μm, preferably from 0.5 to 1.5 μm.

The optical article of the invention may also comprise coatings formed on the antireflection coating that may modify the surface properties thereof, such as hydrophobic and/or oleophobic coatings (anti-fouling top coat). These coatings are preferably deposited onto the outer layer of the antireflection coating. The thickness thereof is generally lower than or equal to 10 nm, preferably ranging from 1 to 10 nm, more preferably from 1 to 5 nm.

There are typically coatings of the fluorosilane or fluorosilazane type. They may be obtained by depositing a fluorosilane or fluorosilazane precursor, comprising preferably at least two hydrolyzable groups per molecule. Fluorosilane precursors preferably comprise fluoropolyether moieties and more preferably perfluoropolyether moieties.

These fluorosilanes are well known and are described, amongst others, in the U.S. Pat. No. 5,081,192. U.S. Pat. Nos. 5,763,061, 6,183,872, 5,739,639, 5,922,787, 6,337,235, 6,277,485 and EP 0933377.

A preferred hydrophobic and/or oleophobic coating composition is marketed by the Shin-Etsu Chemical company under the trade name KP 801M®. Another preferred hydrophobic and/or oleophobic coating composition is marketed by the Daikin Industries company under the trade name OPTOOL DSX®. It is a fluorinated resin comprising perfluoropropylene groups.

Typically, an optical article of the invention comprises a substrate successively coated with an impact-resistant primer layer, an abrasion- and/or scratch-resistant layer, a sub-layer of the invention, a multilayered antireflection stack and a hydrophobic and/or oleophobic coating. The article of the invention is preferably an optical lens, more preferably an ophthalmic lens for eyeglasses, or an optical or an ophthalmic lens blank. The lens may be a polarized lens or a photochromic lens.

Due to its sub-layer resulting from the process according to the invention, the optical article of the invention possesses improved abrasion resistance properties as compared to the same article with a traditionally deposited sub-layer. These abrasion resistance properties may be evaluated according to the Bayer test ASTM, described in the experiment section.

The optical articles of the invention have preferably a BAYER value greater than or equal to 4.5 according to the ASTM standard F 735.81, more preferably greater than or equal to 5 and even more preferably greater than or equal to 5.2.

The various layers of the antireflection coating have good adhesion properties, particularly at the substrate interface. The adhesion properties of the whole antireflection coating to the substrate have been controlled by means of the test ordinarily called "the n×10 blow test", by following the procedure described in the world patent application WO 99/49097.

The optical article of the invention has a high thermal resistance, evaluated through its critical temperature, defined as being the temperature from which cracks can be observed in the antireflection coating. The critical temperature of an article of the invention is preferably greater than or equal to 80° C., more preferably greater than or equal to 85° C. and even more preferably greater than or equal to 90° C.

The optical article of the invention does not absorb or does barely absorb in the visible range, which means, in the context of the present application, that the transmission factor thereof in the visible range λ also called luminous transmittance, is greater than 90%, more preferably greater than 95%, even more preferably greater than 96% and most preferably higher than 97%.

The λ factor does correspond to an international definition (standard ISO 13666:1998) and is measured in accordance with the standard ISO 8980-3. It is defined within the wavelength range ranging from 380 to 780 nm.

Preferably, the light absorption of the coated article of the invention is lower than or equal to 1%. Even preferably, the mean reflection factor in the visible (400-700 nm) of an article coated with an antireflection coating of the invention, written $R_m$, is lower than 2.5% per face, more preferably lower than 2% per face and even more preferably lower than 1% per face of the article. In a most preferred embodiment of the invention, the article comprises a substrate both main surfaces of which are coated with an antireflection coating of the invention and has a $R_m$ total value (reflection values cumulated because of the two faces) lower than 1%, preferably ranging from 0.7 to 0.8%. The procedures to obtain such $R_m$ values are well known from the man skilled in the art.

In the present application, the "mean reflection factor" is such as defined in the standard ISO 13666:1998 and measured in accordance with the standard ISO 8980-4, that is to say it corresponds to the average spectral reflection from 400 to 700 nm.

The following examples are meant to illustrate the invention and are not to be interpreted as limiting the scope thereof.

EXAMPLES

1. General Procedures

The optical articles used in the examples comprise an ORMA® lens substrate from ESSILOR with a diameter of 65 mm, a power of –2.00 diopters and a thickness of 1.2 mm, coated (except example C2) with an impact-resistant primer based on a polyurethane latex comprising polyester units, cured to 90° C. for 1 hour (Witcobond® 234 from BAXENDEN CHEMICALS modified through dilution to reduce the viscosity thereof, spin-coating at 1500 rpm for 10 to 15 seconds) thereafter with the abrasion-resistant and scratch-resistant coating (hard coat) disclosed in example 3 of the patent EP 0614957 (with a refractive index of 1.50), based on a GLYMO and DMDES hydrolyzate, colloidal silica and aluminium acetylacetonate, with an antireflection coating and lastly with an anti-fouling coating.

Said abrasion-resistant and scratch-resistant coating was obtained by depositing and curing a composition comprising by weight, 224 parts of GLYMO, 80.5 parts of HCl 0.1 N, 120 parts of DMDES, 718 parts of 30% by weight colloidal silica in methanol, 15 parts of aluminium acetylacetonate and 44 parts of ethyl cellosolve. The composition further comprises 0.1% by weight relative to the total weight of the composition of a surfactant FLUORAD™ FC-430® from the 3M company.

The layers of the sub-layer and of the multilayered stack of the antireflection coating were deposited without heating the substrates, by vacuum evaporation, optionally, when specified, ion-beam-assisted and/or with oxygen feeding during the deposition (evaporation source: electron gun).

The $SiO_2/Al_2O_3$ mixture used in the examples is L5® marketed by Merck KGaA. The antistatic layers are made from indium-tin oxide, abbreviated as ITO, available from Optron Inc.

The anti-fouling coating was obtained by vacuum evaporation of the OF110 compound provided by the Optron Inc. Company (thickness: 2-5 nm).

The device used for the deposition belongs to a Leybold 1104 apparatus fitted with an electron gun ESV14 (8 kV) for evaporating oxides, with a Joule effect crucible for depositing the top coat and with an End-Hall type ion gun (KRI for examples 1, 2 and C1, Commonwealth Mark II for example C2) for the preliminary phase of the substrate surface preparation with argon ions (IPC) and optionally for that of the sub-layer (example C1 only), as well as for depositing layers under ion assistance.

The thickness of the layers is controlled by means of a quartz scale.

2. Procedures

The process for manufacturing optical articles did comprise the introduction of the substrate coated with a primer coating (except example C2) and with an abrasion-resistant coating into a vacuum deposition chamber, a pumping operation until a secondary vacuum was reached, then an activation of the substrate surface using an argon ion beam (IPC: 2 minutes, 18 $cm^3$/min, 3 A for examples 1, 2 and C1; 2 minutes, 13 sccm, 2.5 A for example C2), the interruption of the ion irradiation, the successive evaporation of the antireflection coating required number of layers, a deposition of the anti-fouling coating (top coat) and lastly a ventilation operation were performed.

Formation of the Antireflection Coating According to the Process of the Invention (Examples 1 and 2)

The process for manufacturing the antireflection coating of the invention comprises:

The deposition of a bilayered $SiO_2$ sub-layer comprising: i) the deposition onto the substrate coated of a first $SiO_2$ layer at a rate of 1 nm/s (without ion assistance) until a thickness of 75 nm was reached (controlled by means of a quartz scale). The closure element of the electron gun is closed and the evaporation stopped; ii) the deposition onto this first layer of a second $SiO_2$ layer at a rate of 1 nm/s under oxygen ion assistance (corresponding to 15 $cm^3$/min-2 A). The deposition of this second layer is conducted by priming the ion gun, preferably with the selected oxygen flow rate. Once the ion beam has been formed and stabilized, the silica granulates are pre-heated again with the electron gun, and the closure element of the electron gun is opened so as to deposit 75 nm thick silica through concomitant ion bombardment. The electron gun closure element is closed, then the evaporation and the ion bombardment are stopped.

The deposition of a multilayered antireflection stack comprising the deposition of the first HI layer ($ZrO_2$) at a rate of 0.3 nm/s, the deposition of the first LI layer ($SiO_2/Al_2O_3$) at a rate of 0.7 nm/s, the deposition of the second HI layer ($TiO_2$, from pre-molten granulates) at a rate of 0.3-0.5 nm/s and under oxygen ion assistance (corresponding to 15 $cm^3$/min-2 A for Example 1 and to 18 $cm^3$/min-3 A for Example 2), the deposition of a third HI layer ($ZrO_2$) at a rate of 0.30 nm/s and under oxygen ion assistance (corresponding to 15 $cm^3$/min-2 A), the deposition of an ITO layer at a rate of 0.2-0.5 nm/s and under oxygen ion assistance (corresponding to 15 $cm^3$/min-2 A), and lastly the deposition of the second LI layer ($SiO_2/Al_2O_3$) at a rate of 1 nm/s.

Formation of the Antireflection Coating in the Comparative Examples C1 and C2

The formation of the antireflection coating comprises the step of depositing the $SiO_2$ sub-layer onto the coated substrate at a rate of 1 nm/s, under an $O_2$ atmosphere and a pressure of $1.5 \cdot 10^{-4}$ mBar (example C1 only), optionally activating the sub-layer surface by means of an argon ion beam (the same treatment as IPC already performed directly on the substrate, example C1 only), stopping the ion irradiation, depositing the first HI layer ($ZrO_2$) at a rate of 0.3 nm/s, depositing the first LI layer ($SiO_2/Al_2O_3$) at a rate of 0.7 nm/s, depositing the second HI layer ($TiO_2$ from pre-molten granulates) at a rate of 0.3-0.5 nm/s, under oxygen ion assistance (corresponding to 18 $cm^3$/min-3 A for C1 and 2.5 A-120 V for C2), and optionally under an $O_2$ atmosphere (under a pressure of $1 \cdot 10^{-4}$ mBar, example C2 only), depositing the third HI layer ($ZrO_2$) at a rate of 0.3 nm/s and optionally under oxygen ion assistance (corresponding to 15 $cm^3$/min-2 A, example C1 only), depositing an ITO layer at a rate of 0.2-0.5 nm/s and under oxygen ion assistance (corresponding to 15 $cm^3$/min-2 A for C1 and 2.5 A-120 V for C2), and lastly depositing the second LI layer ($SiO_2/Al_2O_3$) at a rate of 1 nm/s.

The contents of the optical articles obtained in examples 1, 2 and comparative examples C1 and C2 is detailed hereunder:

| Examples 1 and 2 Substrate + primer + hard coat (a) | |
|---|---|
| *SiO$_2$ | 75 nm |
| *SiO$_2$ (c) | 75 nm |
| ZrO$_2$ | 24 nm |
| SiO$_2$/Al$_2$O$_3$ | 23 nm |
| TiO$_2$ (c) | 90 nm |
| ZrO$_2$ (c) | 15 nm |
| ITO (c) | 13 nm |
| SiO$_2$/Al$_2$O$_3$ | 77 nm |
| Anti-fouling coating | |
| Air | |

| Comparative example 1 (C1) Substrate + primer + hard coat (a) | |
|---|---|
| *SiO$_2$ (a, b) | 150 nm |
| ZrO$_2$ | 24 nm |
| SiO$_2$/Al$_2$O$_3$ | 30 nm |
| TiO$_2$ (c) | 101 nm |
| ZrO$_2$ (c) | 12 nm |
| ITO (c) | 7 nm |
| SiO$_2$/Al$_2$O$_3$ | 78 nm |
| Anti-fouling coating | |
| Air | |

| Comparative example 2 (C2) Substrate + hard coat (a) | |
|---|---|
| *SiO$_2$ (a, b) | 150 nm |
| ZrO$_2$ | 24 nm |
| SiO$_2$/Al$_2$O$_3$ | 30 nm |
| TiO$_2$ (b, c) | 101 nm |
| ZrO$_2$ (c) | 12 nm |
| ITO (c) | 7 nm |
| SiO$_2$/Al$_2$O$_3$ | 78 nm |
| Anti-fouling coating | |
| Air | |

(a) Treatment through ion bombardment of the layer surface prior to depositing the next layer.
(b) Oxygen supply for the deposition.
(c) Deposition of the layer under ion assistance.

3. Characterization of the Abrasion Resistance

The abrasion resistance of the articles manufactured was evaluated by determining the BAYER values by means of the Bayer test (Bayer sand method) in accordance with the standard ASTM F 735.81, with a higher Bayer value meaning a higher abrasion resistance. The Bayer sand value is considered to be good when R is between 3.4 and 4.5, and to be outstanding when R is equal to or higher than 4.5.

Such test consists in making simultaneously oscillate a sample glass and a reference glass with a given reciprocating motion in a tray containing an abrasive powder (about 500 g sand) with a defined particle size at a frequency of 100 cycles/minute for 2 minutes. Measurements of the sample glass "before/after" are compared with those of a reference glass, indeed a CR-39®-based bare glass for which the BAYER value is set to 1. The Bayer sand value is R=H reference glass/H sample glass.

The diffusion measurements were conducted using a Hazeguard system model XL-211 manufactured by Pacific Scientific.

4. Results

The results of the abrasion resistance measurements are given in Table 1 hereunder.

TABLE 1

| Example | Bayer Test ASTM (BAYER SAND) |
|---|---|
| 1 | 6.0 |
| 2 | 5.4 |
| Comparative 1 | 4.7 |
| Comparative 2 | 4.8 |

The lenses of examples 1 and 2 have a better abrasion resistance than those of the comparative examples do.

The invention claimed is:

1. An optical article with antireflection properties, comprising a substrate having at least one main surface coated with an antireflection coating comprising, starting from the substrate:
    a sub-layer comprising two adjacent layers, the sum of the thicknesses of the two adjacent layers being greater than or equal to 75 nm; and
    multilayered antireflection stack comprising at least one high refractive index layer and at least one low refractive index layer,
    wherein the second adjacent layer of the sub-layer is directly deposited upon the first adjacent layer of the sub-layer,
    wherein the deposition of the first adjacent layer of the sub-layer has been carried out without ion assistance and the deposition of the second adjacent layer of the sub-layer has been carried out under ion assistance, and
    wherein the sub-layer is deposited on an abrasion- and/or scratch-resistant coating.

2. The article of claim 1, wherein the two adjacent layers of the sub-layer are formed from the same material.

3. The article of claim 1, wherein the thickness ratio of the sub-layer two adjacent layers to each other varies from 9:1 to 1:9.

4. The article of claim 3, wherein the thickness ratio of the sub-layer two adjacent layers to each other varies from 4:6 to 6:4.

5. The article of claim 1, wherein the sum of the thicknesses of the two adjacent layers is greater than or equal to 80 nm.

6. The article of claim 5, wherein the sum of the thicknesses of the two adjacent layers is greater than or equal to 100 nm.

7. The article of claim 6, wherein the sum of the thicknesses of the two adjacent layers is greater than or equal to 150 nm.

8. The article of claim 1, wherein the sub-layer two adjacent layers are SiO$_2$-based layers.

9. The article of claim 8, wherein the sub-layer two adjacent layers are free of Al$_2$O$_3$.

10. The article of claim 8, wherein the sub-layer consists of SiO$_2$ layers.

11. The article of claim 1, wherein the sub-layer comprises, in addition to the two adjacent layers, from one to three layers interleaved between the substrate and the first adjacent layer of the sub-layer.

12. The article of claim 1, further defined as comprising an ASTM BAYER value greater than or equal to 4.5 of the standard ASTM F 735.81.

13. The article of claim 1, wherein all the low refractive index layers of the multilayered antireflection stack comprise a mixture of $SiO_2$ and $Al_2O_3$.

14. The article of claim 1, wherein the abrasion- and/or scratch-resistant coating is a poly(meth)acrylate or an epoxysilane based coating.

15. The article of claim 1, wherein the high refractive index layers of the multilayered stack comprise at least one of $TiO_2$, $PrTiO_3$, or $ZrO_2$, or combinations thereof.

16. The article of claim 1, further defined as an ophthalmic lens.

17. The article of claim 1, wherein the sub-layer is adjacent to a high refractive index layer of said multilayered antireflection stack.

18. The article of claim 1, wherein the sum of the thicknesses of said two adjacent layers of the sub-layer is lower than 250 nm.

19. The article of claim 1, wherein the sub-layer comprises a higher layer and a lower layer adjacent to each other, the sum of the thicknesses of said two adjacent layers being greater than or equal to 75 nm, said higher layer being an SiO2-based layer.

20. The article of claim 1, wherein the thickness of the abrasion and/or scratch-resistant coating ranges from 2 to 10 µm.

* * * * *